United States Patent
Dosho et al.

(10) Patent No.: US 8,890,741 B2
(45) Date of Patent: Nov. 18, 2014

(54) A/D CONVERTER

(71) Applicant: Panasonic Corporation, Osaka (JP)

(72) Inventors: Shiro Dosho, Osaka (JP); Masao Takayama, Osaka (JP); Takuji Miki, Kyoto (JP)

(73) Assignee: Panasonic Corporation, Osaka (JP)

( * ) Notice: Subject to any disclaimer, the term of this patent is extended or adjusted under 35 U.S.C. 154(b) by 144 days.

(21) Appl. No.: 13/770,871

(22) Filed: Feb. 19, 2013

(65) Prior Publication Data

US 2013/0154867 A1 Jun. 20, 2013

Related U.S. Application Data

(63) Continuation of application No. PCT/JP2011/002517, filed on Apr. 28, 2011.

(30) Foreign Application Priority Data

Aug. 17, 2010 (JP) .................................. 2010-182203

(51) Int. Cl.
H03M 1/50 (2006.01)
H03M 1/12 (2006.01)

(52) U.S. Cl.
CPC .............. *H03M 1/50* (2013.01); *H03M 1/1215* (2013.01)
USPC .......................................... 341/166; 341/155

(58) Field of Classification Search
CPC ........ H03M 1/1215; H03M 1/50; H03M 1/12
USPC .......................................... 341/155, 166, 156
See application file for complete search history.

(56) References Cited

U.S. PATENT DOCUMENTS

| | | | | |
|---|---|---|---|---|
| 7,330,144 B2* | 2/2008 | Terazawa et al. | ............ | 341/157 |
| 8,325,076 B2* | 12/2012 | Yousif et al. | .................. | 341/166 |
| 2008/0267240 A1* | 10/2008 | Miyokawa et al. | .......... | 372/50.1 |
| 2008/0297392 A1 | 12/2008 | Kudo et al. | | |
| 2010/0328130 A1* | 12/2010 | Bulzacchelli et al. | ........ | 341/166 |

OTHER PUBLICATIONS

International Search Report mailed May 31, 2011 issued in corresponding International Application No. PCT/JP2011/002517.
Chun-Cheng Huang, et al., "A CMOS 6-Bit 16-GS/s Time-Interleaved ADC with Digital Background Calibration" Department of Electronics Engineering and Institute of Electronics, National Chiao Tung University, Hsin-Chu, Taiwan, R.O.C. pp. 159-160 (2010).
Manar El-Chammas et al., "A 12-GS/s 81-mW 5-bit Time-Interleaved Flash ADC with Background Timing Skew Calibration" Stanford University, Stanford, CA 94305 USA pp. 157-158 (2010).
Shingo Mandai et al., "Cascaded Time Difference Amplifier using Differential Logic Delay Cell", Dept. of Electrical Engineering and Information Systems, The University of Tokyo VLSI Design and Education Center (VDEC) pp. 194-197 (2009).

* cited by examiner

*Primary Examiner* — Jean B Jeanglaude

(74) *Attorney, Agent, or Firm* — McDermott Will & Emery LLP

(57) ABSTRACT

An A/D converter having high accuracy and high throughput irrespective of characteristic variations of analog circuits is provided. The A/D converter includes a voltage-to-time converter configured to synchronize with a sampling clock signal and convert an input analog voltage to a time difference between two signals, and a plurality of time-to-digital converters each configured to convert the time difference between the two signals to a digital value. The plurality of time-to-digital converters operate in an interleaved manner.

12 Claims, 11 Drawing Sheets

A/D CONVERTER

CROSS-REFERENCE TO RELATED APPLICATIONS

This is a continuation of International Application No. PCT/JP2011/002517 filed on Apr. 28, 2011, which claims priority to Japanese Patent Application No. 2010-182203 filed on Aug. 17, 2010. The entire disclosures of these applications are incorporated by reference herein.

BACKGROUND

The present disclosure relates to analog-to-digital (A/D) converters, and more particularly to improvement in throughput of A/D converters.

With recent development of a ubiquitous technology, a radio technology, a high-speed interface technology, etc., there is an urgent need to achieve high performance of A/D converters which convert analog voltage information to a digital value. However, although large-scale integration devices (LSIs) are miniaturized, it is still difficult to improve performance of A/D converters because analog circuits in LSIs generally do not obey Moore's law. To achieve high performance, A/D converters are arranged in parallel and interleave control is performed on a plurality of A/D converters. Such arrangement can improve the throughput of A/D conversion as a whole, even if an operation speed of a single A/D converter is relatively slow.

When paralleling A/D converters, timing skew of interleave control is a critical factor. Thus, the timing skew is digitally compensated for to improve accuracy of conversion. See, e.g., Manar El-Chammas and Boris Murmann, "A 12-GS/s 81-mW 5-bit Time-Interleaved Flash ADC with Background Timing Skew Calibration," 2010 Symposium on VLSI Circuits/Technical Digest of Technical Papers, pp. 157-158; and Chun-Cheng Huang, Chung-Yi Wang, and Jieh-Tsorng Wu, "A CMOS 6-Bit 16-GS/s Time-Interleaved ADC with Digital Background Calibration," 2010 Symposium on VLSI Circuits/Technical Digest of Technical Papers, pp. 159-160.

A/D converters operating in parallel require a plurality of sample-and-hold circuits holding an analog voltage which is input to each of the A/D converters. Although high accuracy of these sample-and-hold circuits is required, it is difficult for them to hold an analog voltage with high accuracy when LSIs are further miniaturized or designed to operate at lower voltage levels. Unmatched characteristics of the sample-and-hold circuits in the A/D converters operating in parallel degrade conversion accuracy. Thus, although it is conceivable that the characteristic variations of the sample-and-hold circuits are digitally compensated for by each of the sample-and-hold circuits, it is extremely difficult to additionally compensate for variations of frequency characteristics. That is, characteristic variations of the analog circuits such as the sample-and-hold circuits are a bottleneck in improving performance of the A/D converters arranged in parallel.

Thus, there is a need for an A/D converter having high accuracy and high throughput irrespective of characteristic variations of analog circuits.

SUMMARY

An A/D converter according to the present disclosure includes a voltage-to-time converter configured to synchronize with a sampling clock signal and convert an input analog voltage to a time difference between two signals, and a plurality of time-to-digital converters each configured to convert the time difference between the two signals to a digital value. The plurality of time-to-digital converters operate in an interleaved manner.

Accordingly, analog voltage information is first converted to time difference information, and then, distributed to the plurality of time-to-digital converters, where the time difference information is digitally converted. Time difference information is hardly affected by characteristics of analog circuits, and thus, high accuracy and high throughput irrespective of the characteristic variations of analog circuits can be achieved.

For example, the A/D converter may include a plurality of gate circuits each configured to perform gate control on the two signals, and input the two signals to each of the plurality of time-to-digital converters in a round robin fashion. Accordingly, the plurality of time-to-digital converters can operate in an interleaved manner.

Moreover, the A/D converter may include a plurality of gate control circuits controlling each of the plurality of gate circuits. Each of the gate control circuits causes a corresponding gate circuit to block signals and generates a trigger signal upon detecting that the two signals have passed through the corresponding gate circuit, and causes the corresponding gate circuit to pass signals upon receiving a trigger signal generated from another one of the gate control circuits. Accordingly, the plurality of time-to-digital converters can asynchronously operate in an interleaved manner.

Each of the gate circuits may selectively output either test signals of the two signals or the two signals. Accordingly, the time-to-digital converters can digitally compensate for conversion errors based on the test signals.

The A/D converter may include a plurality of time amplifier circuits each configured to amplify the time difference between the two signals. Each of the plurality of time-to-digital converters may convert a time difference between two signals output from each of the plurality of time amplifier circuits to a digital value. Accordingly, even if a sampling frequency is increased so that a time difference between the two signals is small, the time-to-digital converters can perform accurate digital conversion.

The A/D converter may include a plurality of crossbar switches each configured to switch paths of the two signals from the voltage-to-time converter to a corresponding one of the plurality of time-to-digital converters. Accordingly, the time-to-digital converters can detect and digitally compensate for unbalance between the paths of the two signals.

DETAILED DESCRIPTION

The embodiments are described in detail below with reference to the attached drawings. However, unnecessarily detailed description may be omitted. For example, detailed description of well known techniques or description of the substantially same elements may be omitted. Such omission is intended to prevent the following description from being unnecessarily redundant and to help those skilled in the art easily understand it.

The inventors provide the following description and the attached drawings to enable those skilled in the art to fully understand the present disclosure. Thus, the description and the drawings are not intended to limit the scope of the subject matter defined in the claims.

(Embodiments of A/D Converters)

Figure 1:
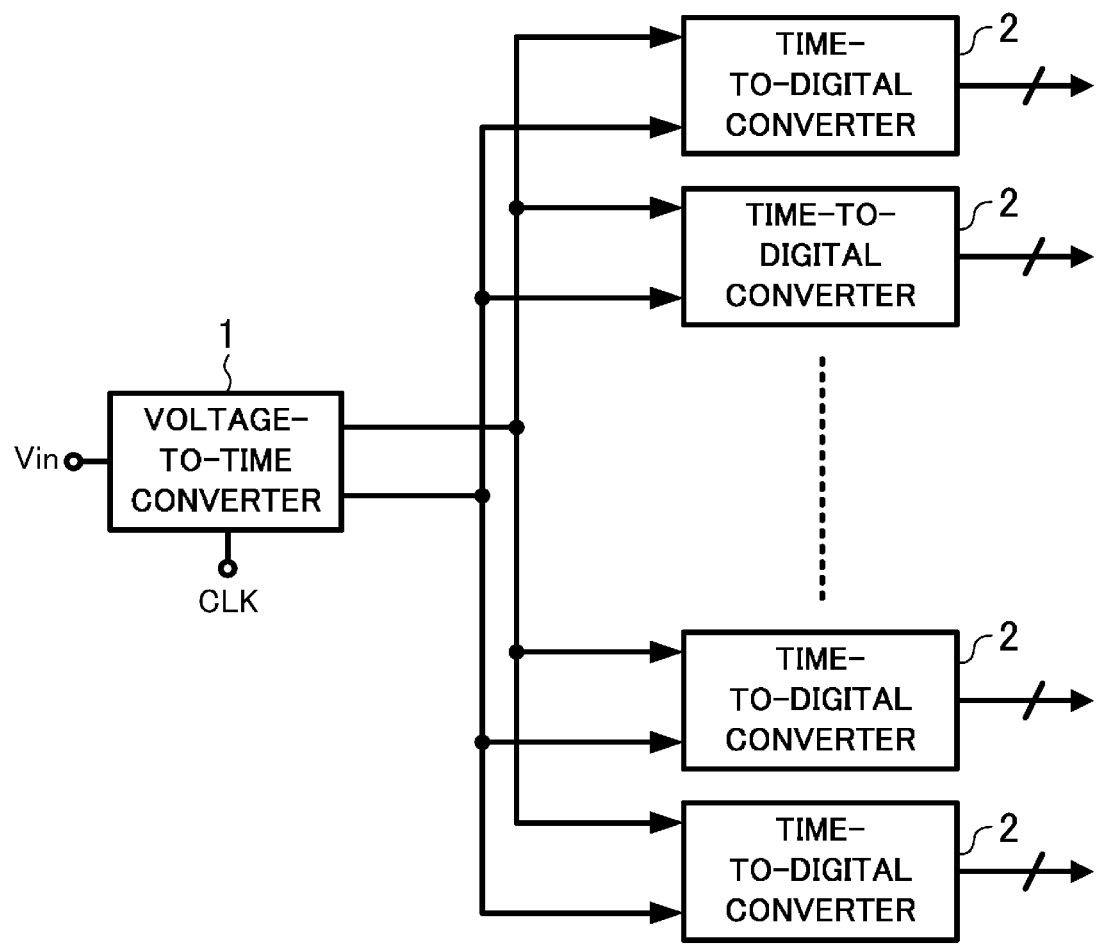
FIG. 1 is a block diagram of an A/D converter according to one embodiment of the present disclosure.

FIG. 1 illustrates a configuration of an A/D converter according to one embodiment. The A/D converter includes a voltage-to-time converter 1 and a plurality of time-to-digital converters 2. The voltage-to-time converter 1 synchronizes with a sampling clock signal CLK, and converts an input analog voltage Vin to a time difference between two signals. The voltage-to-time converter 1 may have any configuration as long as the voltage-to-time converter 1 generates two signals of which corresponding rising or falling edges represent such a time difference. For convenience, the two signals are assumed to define the time difference at their corresponding rising edges in the following discussion. Since the time difference between corresponding two edges of two signals is indicative of an input analog voltage Vin, a voltage level of each of the converted signals is no object. That is, voltage levels of such two converted signals may be different from each other.

Figure 2:
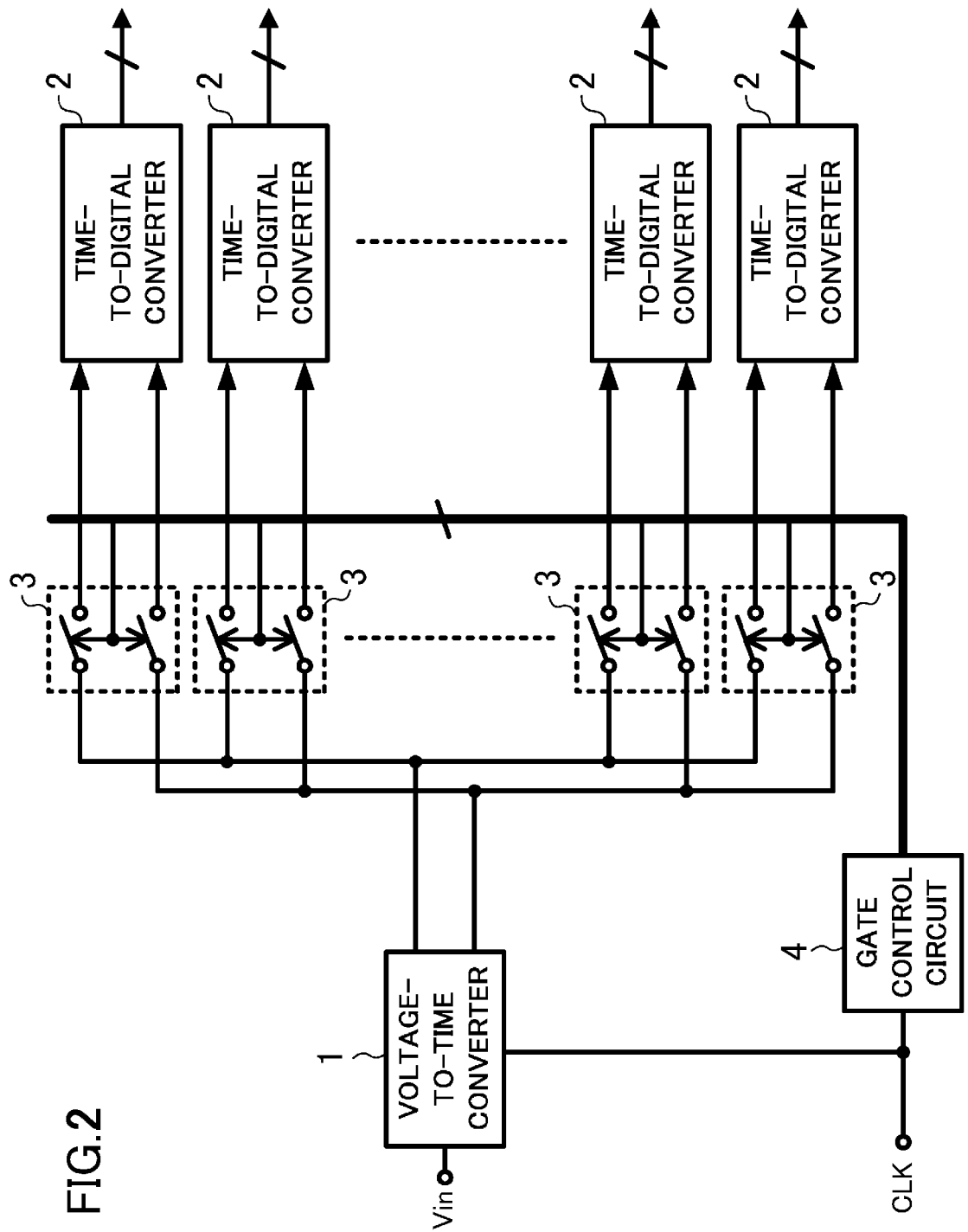
FIG. 2 is a block diagram of an A/D converter to which synchronously controlled gate circuits have been added.

The two signals are input to each of the plurality of time-to-digital converters 2. Each of the time-to-digital converters 2 converts a time difference between the two input signals to a digital value. The time-to-digital converters 2 may have any suitable resolution and configuration. Thus, the plurality of time-to-digital converters 2 operate in an interleaved manner, thereby realizing A/D conversion of Vin. For example, interleaved operation can be performed by a ring counter, provided in the time-to-digital converters 2, which operates in synchronization with a CLK to convert input signals every time the count value reaches a predetermined value. Alternatively, as illustrated in FIG. 2, a gate circuit 3 performing gate control on two signals may be provided to each of the time-to-digital converter 2 so that the gate circuits 3 are controlled by a gate control circuit 4 in a round robin fashion. The gate circuit 3 can include two AND gates, each of which receives two signals. The gate control circuit 4 can include a ring counter operating in synchronization with CLK, for example.

Figure 3:
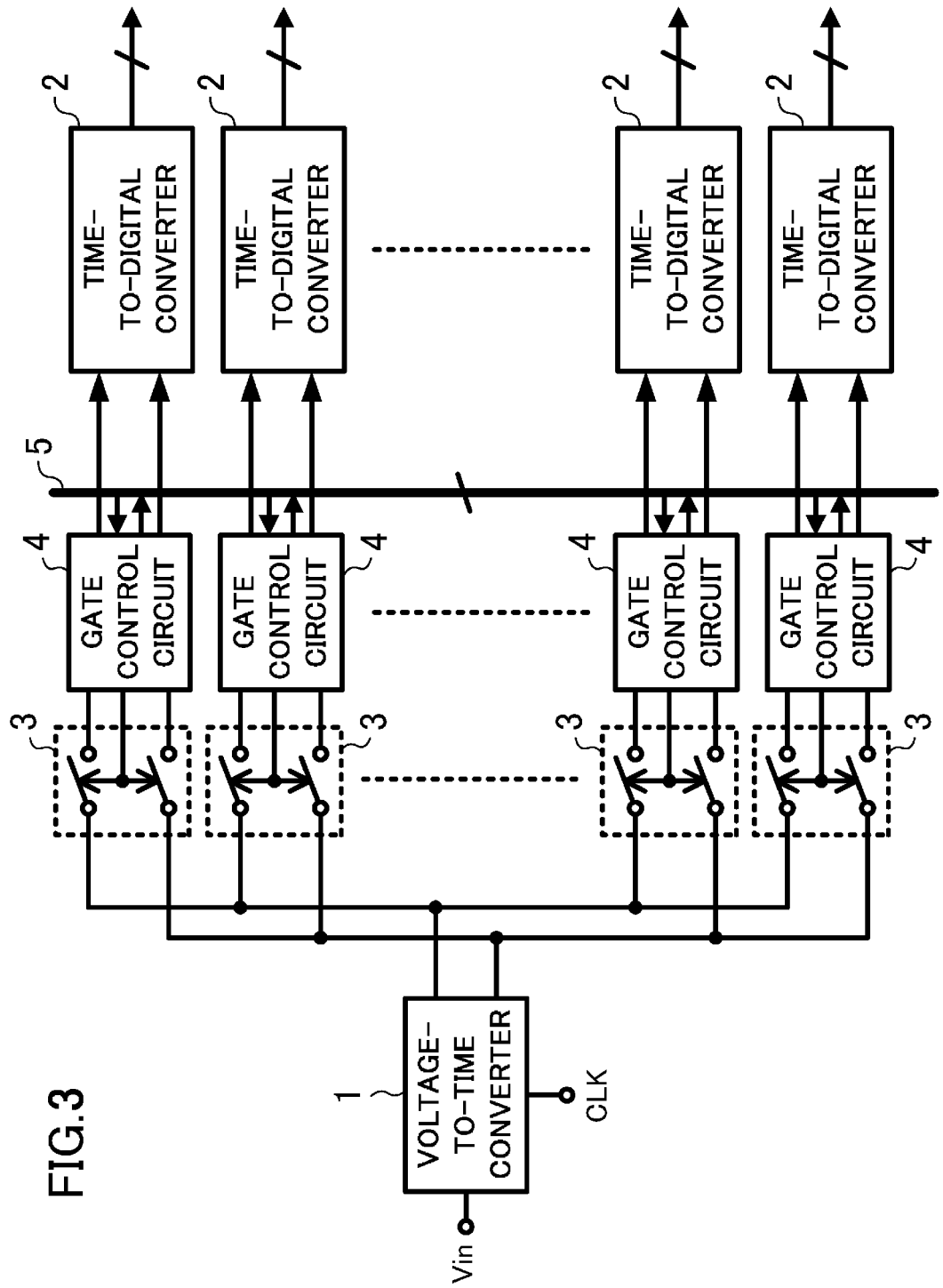
FIG. 3 is a block diagram of an A/D converter to which asynchronously controlled gate control circuits have been added.

Greater complexity of the circuit increases the path length of a gate control signal of the configuration illustrated in FIG. 2, which makes it difficult to adjust a wiring delay occurring until arrival of two signals at the gate circuits 3, and a wiring delay occurring until arrival of a gate control signal. Thus, as illustrated in FIG. 3, the gate control circuit 4 may be provided to each of the gate circuits 3 to asynchronously control the gate circuits 3. In this case, when one gate control circuit 4 receives a trigger signal from another, the former causes the corresponding gate circuit 3 to pass signals. Once the gate control circuit 4 detects that two signals have passed through the corresponding gate circuit 3, the gate control circuit 4 causes this gate circuit 3 to block signals, and generates a trigger signal. The trigger signals can be exchanged through, e.g., a trigger bus 5.

Figure 4:
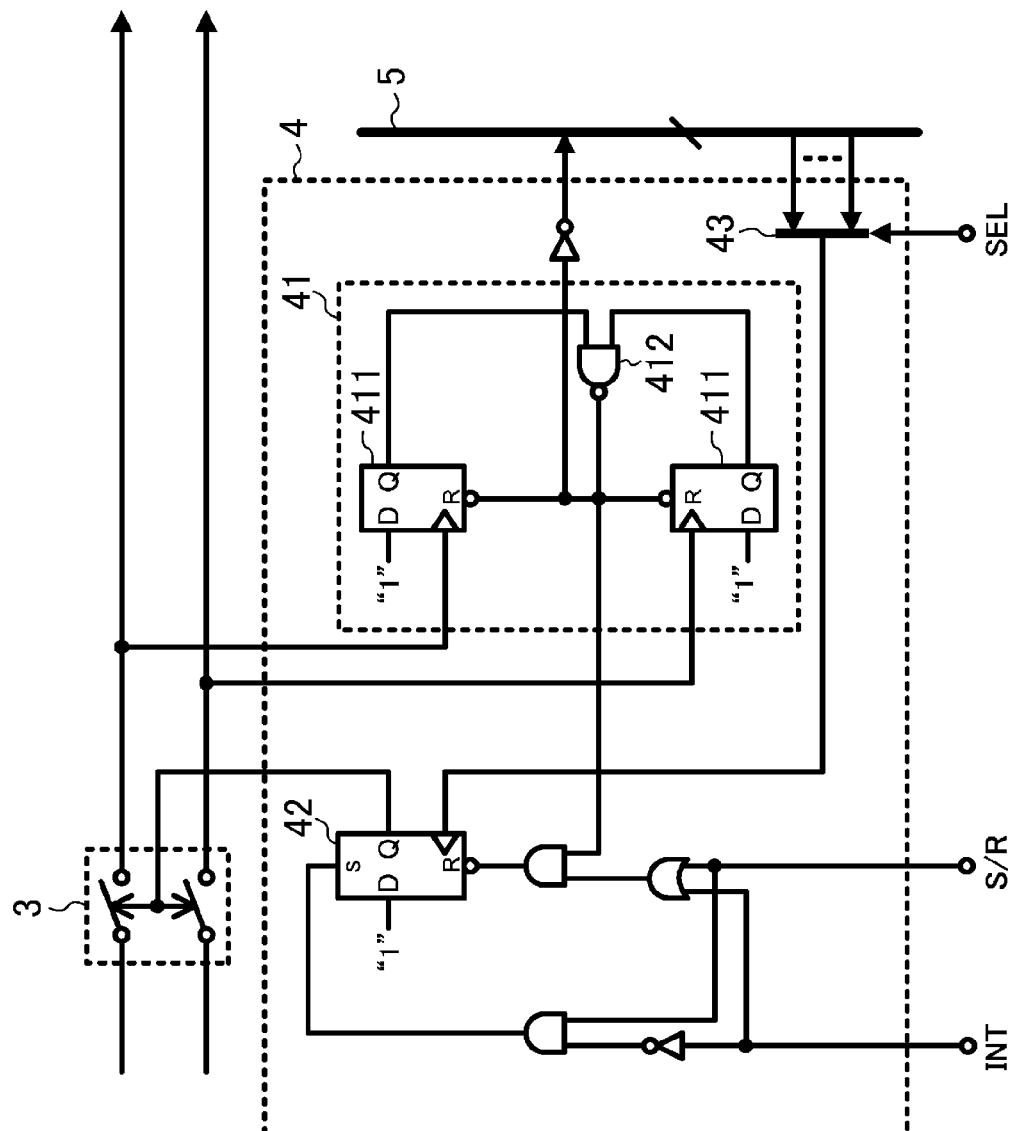
FIG. 4 is a block diagram of an asynchronously controlled gate control circuit.

FIG. 4 illustrates an example configuration of the gate control circuit 4. A pass detection circuit 41 of the gate control circuit 4 generates a trigger signal when detecting that two signals have passed through the gate circuit 3. Specifically, the pass detection circuit 41 can include two flip-flops 411 receiving a fixed input "1" and each of two outputs of the gate circuit 3 serves as a clock input, and a NAND gate 412 resetting the two flip-flops 411 by performing a NAND operation on outputs of the two flip-flops 411. The pass detection circuit 41 of this configuration outputs a low active one-shot pulse when both the two signals transition from logic "0" to logic "1," i.e., when the two signals pass through the gate circuit 3. Then, an inverted one-shot pulse serves as a trigger signal, which is transmitted to another one of the gate control circuits 4 through the trigger bus 5.

A flip-flop 42 of the gate control circuit 4 controls the gate circuit 3. The flip-flop 42 outputs a fixed input "1" using a trigger signal generated by one of the other gate control circuits 4 as a trigger. When "1" is input to the gate circuit 3, signals are allowed to pass therethrough. A trigger signal input to the flip-flop 42 is selected by a multiplexer 43. Trigger signals of all the gate control circuits 4 are input to the multiplexer 43 through the trigger bus 5, and any one of the trigger signals can be selected by a select signal SEL. The flip-flop 42 is reset by a one-shot pulse output from the pass detection circuit 41. Therefore, when the pass detection circuit 41 detects passes of two signals and outputs a one shot-pulse, the flip-flop 42 is reset and outputs "0." The gate circuit 3 is caused to block signals when "0" is input thereto.

The flip-flop 42 can be initialized by an initialization signal INT and a set/reset control signal S/R. Specifically, the flip-flop 42 is initialized to "1" when S/R is "1," and initialized to "0" when S/R is "0." Therefore, if the flip-flop 42 in any one of the plurality of gate control circuits 4 is initialized to "1," and the other flip-flops 42 are initialized to "0," each of the gate control circuits 4 subsequently controls the gate circuit 3 in turn based on a trigger signal.

Figure 5:
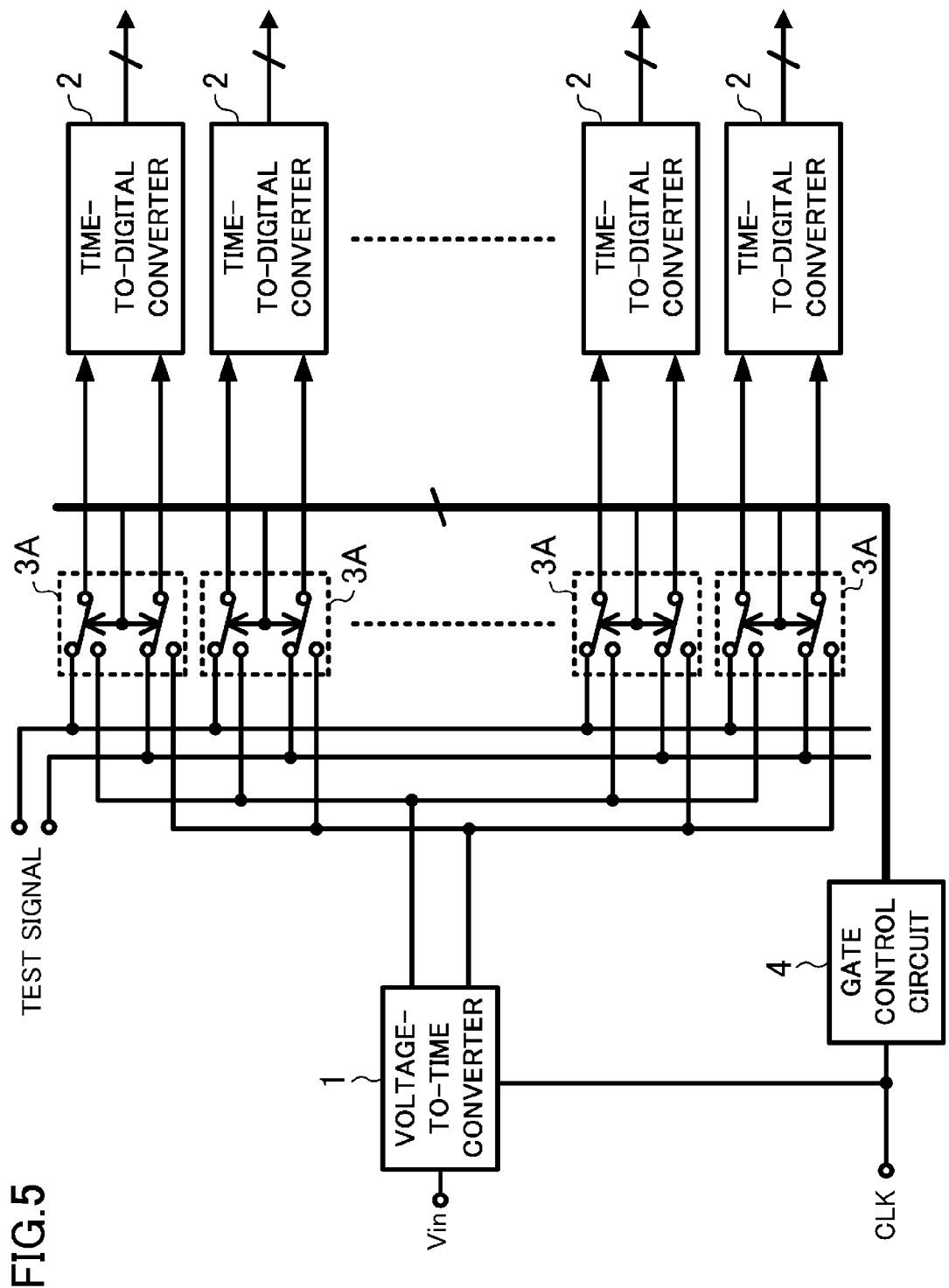
FIG. 5 is a block diagram of an A/D converter which allows input of test signals.

The gate circuits 3 illustrated in FIG. 2 may be modified to allow test signals of two signals to be input to the time-to-digital converters 2. The time-to-digital converters 2 can compute digital compensation values based on input test signals to compensate for conversion errors in a digital domain. FIG. 5 illustrates a configuration of an A/D converter which allows inputting test signals. Gate circuits 3A selectively output either test signals or two signals. Specifically, the gate circuits 3A input test signals to the time-to-digital converters 2 when blocking two signals. When the gate circuits 3A are asynchronously controlled, the gate control circuit 4 instructing the gate circuits 3A to select test signals needs to be separated from a trigger signal chain if necessary. With the gate control circuits 4 in FIG. 4, an appropriate change of the SEL allows any of the gate control circuits 4 to be isolated from the trigger signal chain, and allows a new trigger signal chain to be easily reconfigured.

Figure 6:
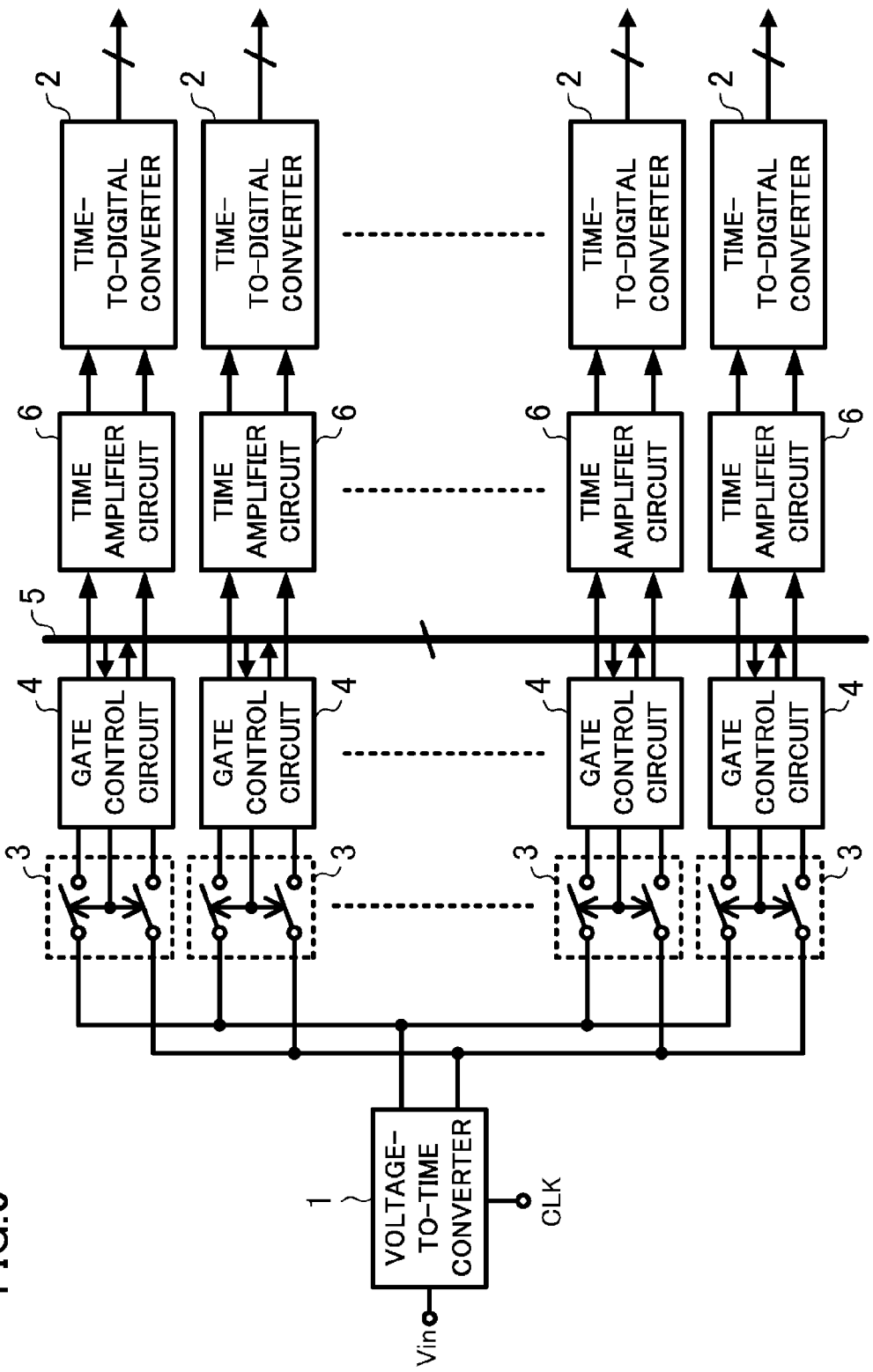
FIG. 6 is a block diagram of an A/D converter to which time amplifier circuits have been added.

When a sampling frequency of this A/D converter is increased, a maximum time difference between two signals output from the voltage-to-time converter 1 becomes small. However, as a time difference between the two signals becomes small, jitter of two signals becomes relatively large, thereby decreasing accuracy of conversion in the time-todigital converters 2. Therefore, as illustrated in FIG. 6, a plurality of time amplifier circuits 6 may be added to the configuration of FIG. 3 to amplify a time difference between two signals output from the voltage-to-time converter 1 and input them to each of the time-to-digital converters 2. The time amplifier circuits 6 may be added to a configuration other than that of FIG. 3. The time amplifier circuits 6 may have any configuration as long as each of the time amplifier circuits 6 amplifies a time difference between two input signals and outputs two signals. Therefore, an input jitter tolerance of the time-to-digital converters 2 is improved, and thus the time-to-digital converters 2 are easily designed. Moreover, the time-to-digital converters 2 can be designed with gate circuits having smaller drive capabilities, and thus power consumption of the time-to-digital converters 2 can be reduced.

Figure 7:
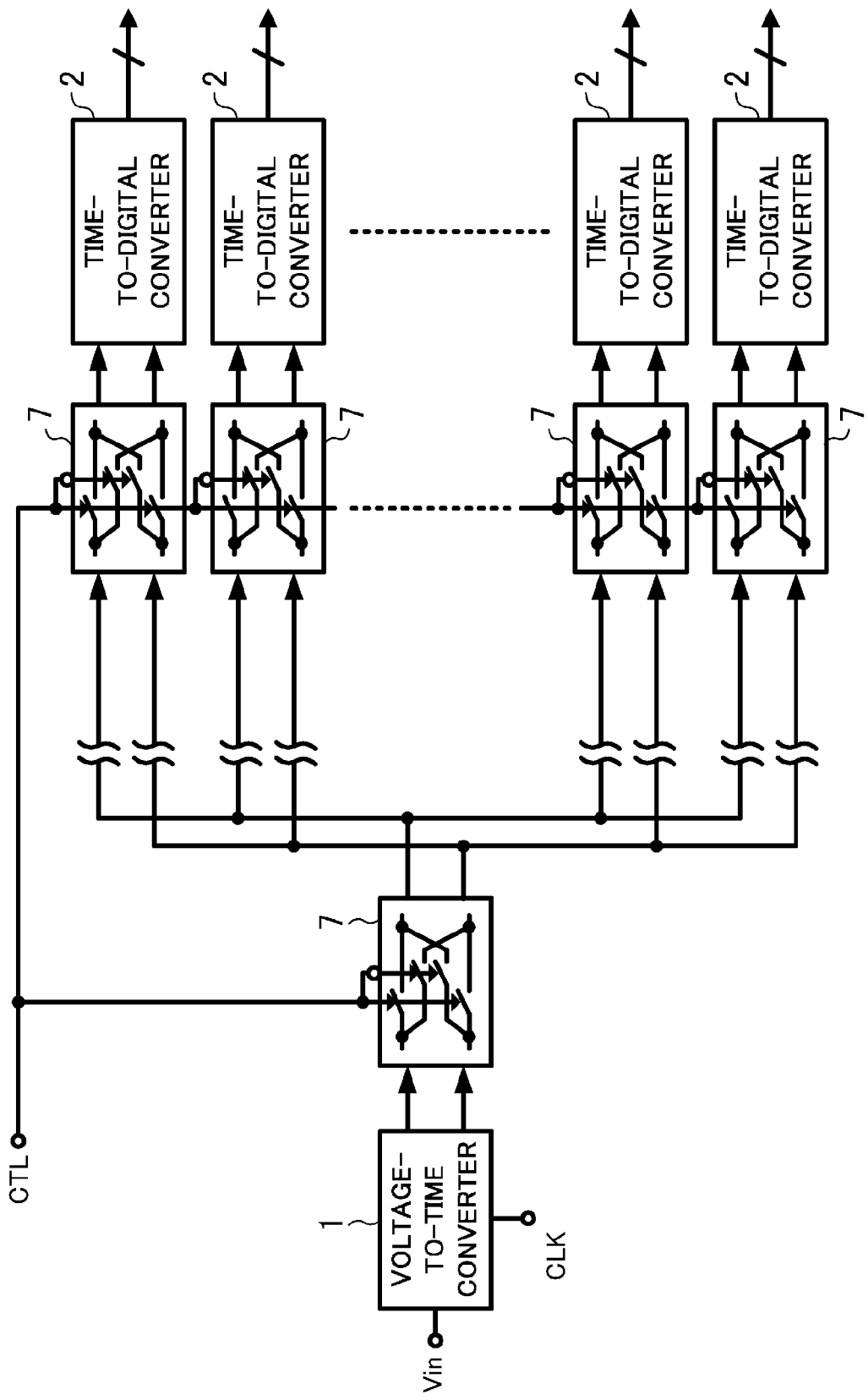
FIG. 7 is a block diagram of an A/D converter to which crossbar switches have been added.

If the voltage-to-time converter 1 and the time-to-digital converters 2 are located away from each other, or if they have various circuits such as the time amplifier circuits 6 inserted therebetween, path lengths of the two signals output from the voltage-to-time converter 1 which reach the time-to-digital converters 2 become unbalanced, thereby causing an error in a time difference between two signals. Therefore, as illustrated in FIG. 7, a plurality of crossbar switches 7 interchanging paths of two signals each other may be provided. The crossbar switches 7 are controlled based on a control signal CTL, and switch paths of two signals all at once. The time-to-digital converters 2 compute digital compensation values based on signals which are input before and after paths are switched, and then, can compensate for path errors in a digital domain. Note that each of the crossbar switches 7 is preferably inserted immediately downstream of the voltage-to-time converter 1, and immediately upstream of the time-to-digital converters 2.

Figure 8A:
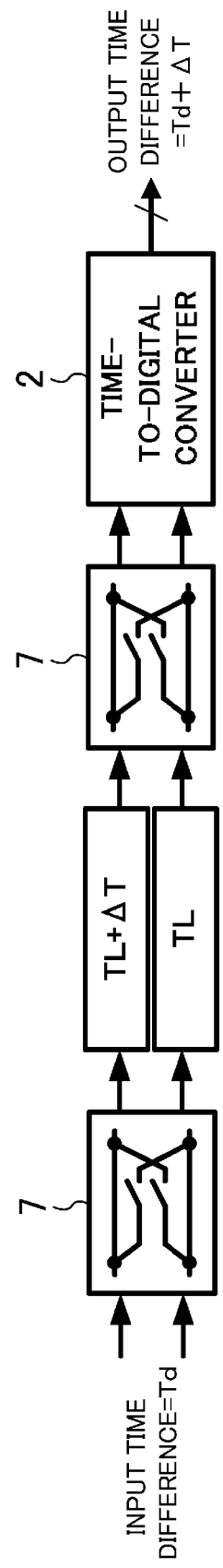
FIGS. 8A and 8B are schematic diagrams illustrating a principle of compensation for path errors.
Figure 8B:
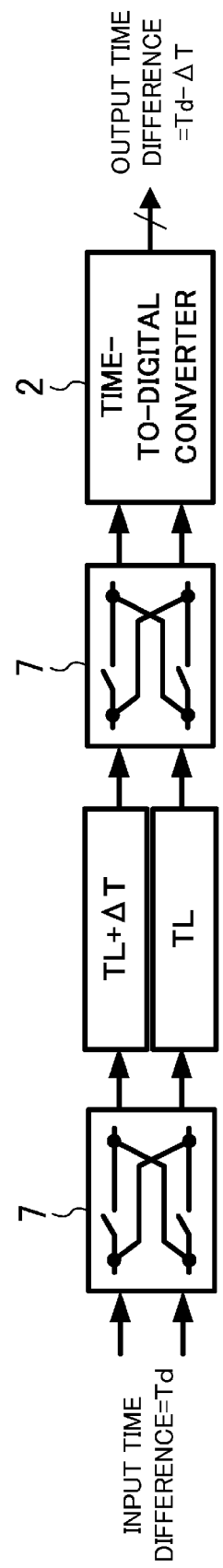

FIG. 8 schematically illustrates principles of compensation for path errors. The time difference between two signals is denoted by Td. One path delay of two signals is denoted by TL, and the other by TL+ΔT. That is, ΔT is a path error. First, the paths are connected straight by the crossbar switches 7 (see FIG. 8A). In this case, a conversion result by the time-to-digital converter 2 corresponds to a value of Td+ΔT. Next, the paths are crossed by the crossbar switches 7 (see FIG. 8B). In this case, a conversion result by the time-to-digital converter 2 corresponds to a value of Td−ΔT. Accordingly, the path error ΔT can be calculated by subtracting a value when the paths are crossed from a value when paths are straight at the crossbar switch 7, and dividing the result by 2. Thus, the path error of a digital value converted by the time-to-digital converters 2 is canceled by compensating for the path error.

As described above, according to the A/D converter of this embodiment, analog voltage information is first converted to time difference information, and then, distributed to the plurality of time-to-digital converters 2. Time difference information is hardly affected by the transfer characteristics of the paths, and even if affected, such an error can be easily compensated for. Moreover, time difference information is unrelated to the frequency characteristics, and thus, there is no variation in time difference information to be input to each of the time-to-digital converters 2. Therefore, high accuracy and high throughput of the A/D converter can be achieved. Furthermore, the circuit complexity and power consumption of the time-to-digital converters 2 can be reduced because the sample-and-hold circuits are unnecessary.

(Embodiment of Voltage-to-Time Converter)

In general, a voltage-to-time converter is realized as a variable delay circuit which delays an input signal by an amount depending on an input analog voltage and outputs the delayed signal. That is, the input analog voltage is represented as a delay time of a signal output from the variable delay circuit. A typical variable delay circuit includes a buffer circuit of which an output drive capability is adjusted by an input analog voltage, a capacitor connected to an output terminal of the buffer circuit, and a waveform shaping circuit shaping a charging voltage waveform of the capacitor. That is, the delay time of an output signal is controlled by adjusting a charging/discharging current of the capacitor by an input analog voltage, and controlling the time at which a charging voltage of the capacitor crosses a threshold value of the waveform shaping circuit.

However, the conventional configuration has a disadvantage that jitter of an output signal is increased when a waveform rounding by the capacitor is increased by an influence of input conversion noise of the waveform shaping circuit. That is, an increase in the delay time significantly degrades output accuracy. Therefore, a voltage-to-time converter described below is preferably used because there is a concern about lack of accuracy of the conventional voltage-to-time converter when it is used as the voltage-to-time converter 1 of the A/D converter described above.

Figure 9:
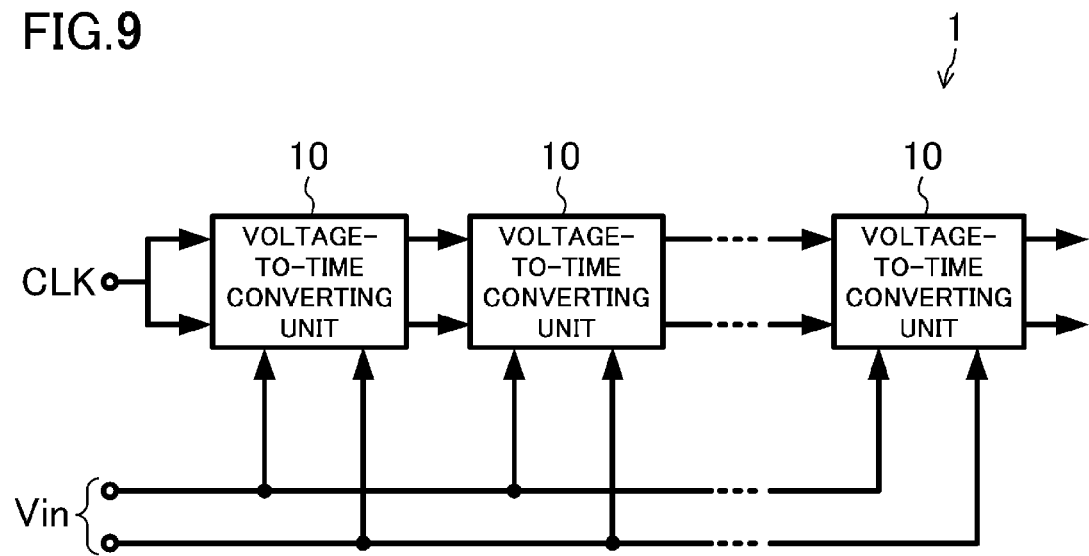
FIG. 9 is a block diagram of a voltage-to-time converter according to one embodiment of the present disclosure.
Figure 10:
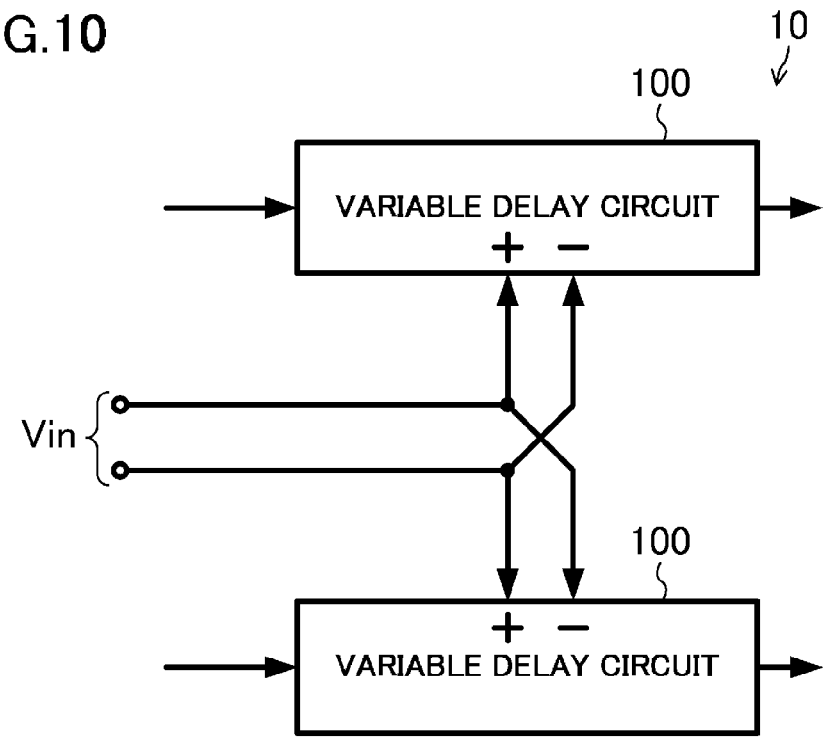
FIG. 10 is a block diagram of a voltage-to-time converting unit.

FIG. 9 illustrates a configuration of a voltage-to-time converter according to one embodiment. The voltage-to-time converter 1 of this embodiment includes a plurality of voltage-to-time converting units 10 connected in cascade. Each of the voltage-to-time converting units 10 outputs two signals at different times depending on the analog voltage Vin as a differential signal. A sampling clock signal CLK is input to the voltage-to-time converting unit 10 at the first stage. As illustrated in FIG. 10, each of the voltage-to-time converting units 10 includes two variable delay circuits 100. Vin is input to each of the two variable delay circuits 100 as a differential signal, whose polarity is opposite between the two variable delay circuits 100. Each of the variable delay circuits 100 delays one and the other of the two signals input to the voltage-to-time converting unit 10 by an amount depending on the Vin, and outputs the delayed signals.

Figure 11:
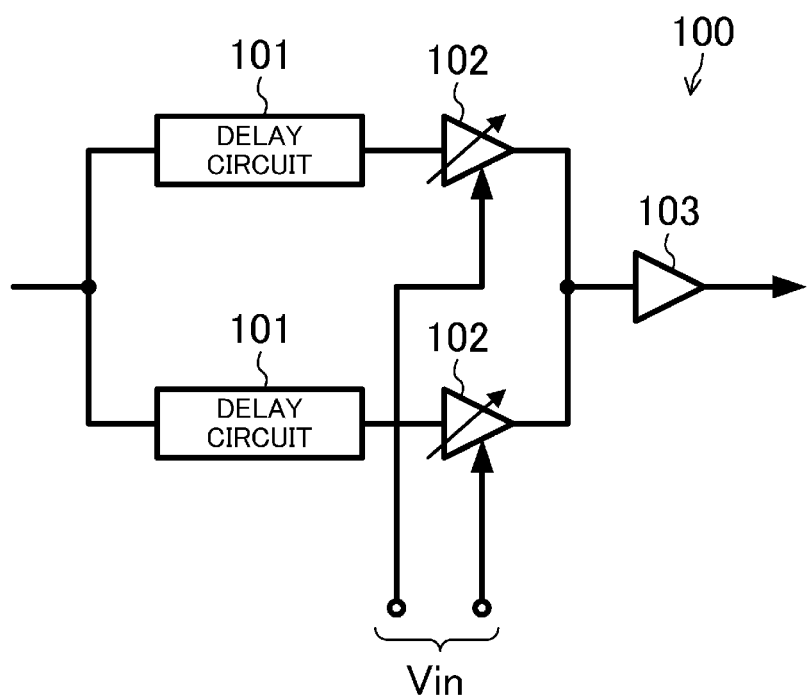
FIG. 11 is a block diagram of a variable delay circuit.

FIG. 11 illustrates a configuration of the variable delay circuit 100. The variable delay circuit 100 can include two delay circuits 101, two buffer circuits 102, and a waveform shaping circuit 103. The two delay circuits 101 delay a common input signal by different amounts, and output the delayed signals. Outputs of the two delay circuits 101 are input to the two buffer circuits 102. Output drive capabilities of the two buffer circuits 102 are controlled by respective signals Vin as a differential signal serving as control signals. Outputs of the two buffer circuits 102 are combined into one signal. The waveform shaping circuit 103 shapes a waveform of the combined output of the two buffer circuits 102.

Figure 12:
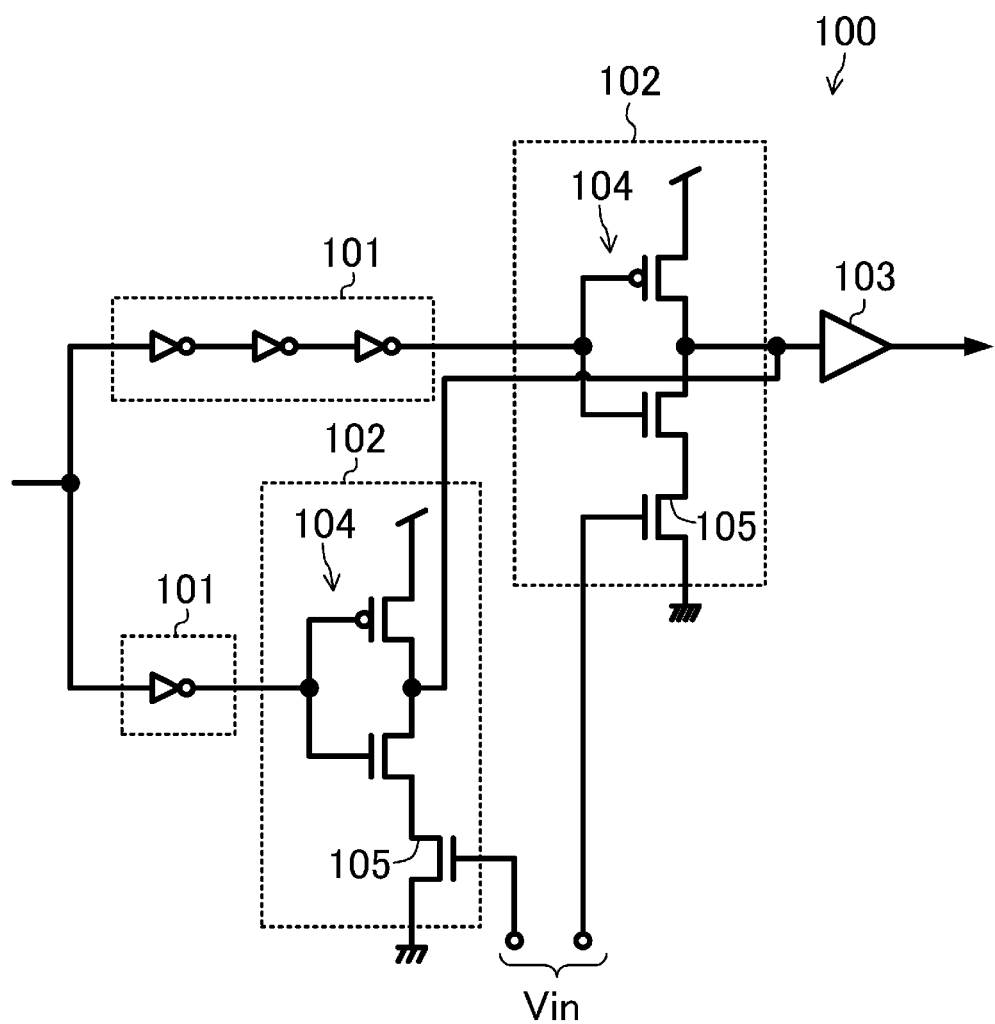
FIG. 12 is a more specific block diagram of the variable delay circuit.

FIG. 12 illustrates a specific example configuration of the variable delay circuit 100. The delay circuits 101 may be a single inverter circuit, or a plurality of inverter circuits connected in cascade. The buffer circuits 102 can include an inverter circuit 104, and an NMOS transistor 105 connected in series to an NMOS transistor constituting the inverter circuit 104 and having a gate to which a control signal is applied. As such, the variable delay circuit 100 can be configured with the transistors without using a capacitor. Note that the NMOS transistor 105 may be replaced by a PMOS transistor connected in series to a PMOS transistor constituting the inverter circuit 104 having a gate to which a control signal is applied. Alternatively, a transistor for controlling current may be connected to the sources of the PMOS and NMOS transistors constituting the inverter circuit 104, thereby providing current control.

Signals input to the variable delay circuit 100 of the above-described configuration are delayed in the two delay circuits 101 by different amounts, and then, are input to the two buffer circuits 102. Output drive capabilities of the two buffer circuits 102 are controlled by a first and second signals of a differential signal, and thus, when the output drive capability of one buffer circuit 102 increases, the output drive capability of the other buffer circuit 102 decreases. Therefore, the two signals, which are delayed by different amounts and output from the two buffer circuits 102, are blended depending on the output drive capabilities of the two buffer circuits 102. Accordingly, a signal delayed by an amount corresponding to the intermediate between the delay amounts of the two delay circuits 101 is generated as a combined output of the two buffer circuits 102. Moreover, the delay time can be generally linearly changed depending on the signals Vin by decreasing a difference between delay times of the two delay circuits 101.

As describe above, the voltage-to-time converter of this embodiment can significantly decrease jitter superimposed on a delayed and output signal because a waveform rounding is not used to delay the signal. Therefore, output accuracy of the voltage-to-time converter can be increased.

Note that, the voltage-to-time converter 1 may include one voltage-to-time converting unit 10. The number of the voltage-to-time converting units 10 to be connected only have to be determined depending on a necessary output dynamic range. For example, the output dynamic range of the voltage-to-time converter 1 can be 300 ps by connecting in cascade the thirty voltage-to-time converting units 10, each of which can achieve a maximum signal delay of 10 ps.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

The invention claimed is:

1. An A/D converter comprising:
a voltage-to-time converter configured to synchronize with a sampling clock signal and convert an input analog voltage to a time difference between two digital signals; and
a plurality of time-to-digital converters each configured to convert the time difference between the two digital signals to a digital value, wherein
the plurality of time-to-digital converters operate in an interleaved manner.

2. The A/D converter of claim 1, further comprising:
a plurality of gate circuits each configured to perform gate control on the two digital signals, and input the two digital signals to each of the plurality of time-to-digital converters in a round robin fashion.

3. The A/D converter of claim 2, further comprising:
a plurality of gate control circuits each configured to control a corresponding one of the plurality of gate circuits, wherein each of the gate control circuits causes a corresponding gate circuit to block signals and generates a trigger signal upon detecting that the two digital signals have passed through the corresponding gate circuit, and causes the corresponding gate circuit to pass signals upon receiving a trigger signal from another one of the gate control circuits.

4. The A/D converter of claim 2, wherein
each of the gate circuit selectively outputs either test signals of the two digital signals or the two digital signals.

5. The A/D converter of claim 1, further comprising:
a plurality of time amplifier circuits each configured to amplify the time difference between the two digital signals, wherein
each of the plurality of time-to-digital converters converts a time difference between two digital signals output from each of the plurality of time amplifier circuits to a digital value.

6. The A/D converter of claim 1, further comprising:
a plurality of crossbar switches each configured to switch paths of the two digital signals from the voltage-to-time converter to a corresponding one of the plurality of time-to-digital converters.

7. The A/D converter of claim 1, wherein
the voltage-to-time converter includes a single voltage-to-time converting unit or a plurality of voltage-to-time converting units connected in cascade, each of which outputs two input digital signals at different times depending on the analog voltage, and
the voltage-to-time converting unit at a first stage is configured to receive the sampling clock.

8. The A/D converter of claim 7, wherein
the voltage-to-time converting unit includes two variable delay circuits configured to receive the analog voltage as a differential signal whose polarity is opposite between the two variable delay circuits, and
each of the two variable delay circuits is configured to delay each of the two input digital signals by an amount depending on the analog voltage to generate a delayed signal, and output the delayed signal.

9. The A/D converter of claim 8, wherein
each of the two variable delay circuits includes
two delay circuits configured to delay a common input signal by different amounts to generate delayed signals, and output the delayed signals,
two buffer circuits each configured to receive an output of each of the two delay circuits, whose output drive capabilities are controlled by a first and second signals of the differential signal serving as a control signal, respectively, and whose outputs are combined into one signal, and
a waveform shaping circuit configured to shape a waveform of the combined output of the two buffer circuits.

10. The A/D converter of claim 9, wherein
each of the two delay circuits includes a single inverter circuit or a plurality of inverter circuits connected in cascade.

11. The A/D converter of claim 9, wherein
each of the two buffer circuits includes
an inverter circuit, and
a transistor connected in series to a transistor constituting the inverter circuit, and having a gate to which the control signal is applied.

12. An A/D converter comprising:
a voltage-to-time converter configured to receive an analog signal and a clock signal separately, and to output two clock signals having a time difference produced by delaying the clock signal depending on a value of the analog signal; and a plurality of time-to-digital converters each configured to convert the time difference between the two clock signals to a digital value, wherein the plurality of time-to-digital converters operate in an interleaved manner.

* * * * *